US006803649B1

(12) United States Patent
He et al.

(10) Patent No.: US 6,803,649 B1
(45) Date of Patent: Oct. 12, 2004

(54) ELECTRONIC ASSEMBLY

(75) Inventors: Jiangqi He, Chandler, AZ (US); Jung Kang, Chandler, AZ (US); Dong Zhong, Chandler, AZ (US); Yuan-Liang Li, Chandler, AZ (US); John Tang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/440,322

(22) Filed: May 16, 2003

(51) Int. Cl.[7] .................................................. H01L 23/52

(52) U.S. Cl. ....................... 257/691; 257/774; 257/723; 257/775

(58) Field of Search ................................ 257/691, 774, 257/775, 723

(56) References Cited

U.S. PATENT DOCUMENTS

| | | | | |
|---|---|---|---|---|
| 4,901,136 A | * | 2/1990 | Neugebauer et al. | 257/691 |
| 5,708,296 A | * | 1/1998 | Bhansali | 257/698 |
| 5,854,534 A | * | 12/1998 | Beilin et al. | 257/691 |
| 6,198,635 B1 | * | 3/2001 | Shenoy et al. | 361/760 |
| 6,388,207 B1 | * | 5/2002 | Figueroa et al. | 174/262 |
| 6,400,576 B1 | * | 6/2002 | Davidson | 361/763 |
| 6,455,885 B1 | * | 9/2002 | Lin | 257/300 |
| 6,495,770 B2 | * | 12/2002 | Li et al. | 174/255 |
| 6,521,530 B2 | * | 2/2003 | Peters et al. | 438/667 |
| 2002/0074670 A1 | * | 6/2002 | Suga | 257/777 |

* cited by examiner

*Primary Examiner*—Jasmine Clark
(74) *Attorney, Agent, or Firm*—Blakely, Sokoloff, Taylor & Zafman LLP

(57) ABSTRACT

According to one aspect of the invention, a electronic assembly is provided. The electronic assembly includes a motherboard, a first microelectronic die on a package substrate, a second microelectronic die, and a strip of flex tape interconnecting the microelectronic dies. The package substrate has a metal core with via openings, power conductors connecting a top and bottom surface of the substrate and passing through the via openings, and ground conductors interconnecting the metal core with the top and bottom surface of the package substrate. The flex tape has signal conductors which interconnect the microelectronic dies. Power is provided to the first microelectronic die via the power conductors. IO signals are sent between the microelectronic dies over the signal conductors in the flex tape.

20 Claims, 5 Drawing Sheets

24
28
26
30
16
4
22
126
118
110
114
112
18
116
12
108
4

ELECTRONIC ASSEMBLY

BACKGROUND OF THE INVENTION

1). Field of the Invention

This invention relates generally to an electronic assembly and more specifically to the manner in which power, ground, and signals are provided to integrated circuits of the electronic assembly.

2). Discussion of Related Art

Integrated circuits are formed on semiconductor wafers. The wafers are then sawed into microelectronic dies, also known as semiconductor chips. Each semiconductor chip is then mounted to a package, or carrier, substrate. Often the packages are then mounted to a motherboard.

The integrated circuit receives power, ground, and other electronic signals through contacts located between the semiconductor chip and the carrier substrate and vias in the package substrate. The vias extend from an upper surface to a lower surface of the carrier substrate and pass through a core made of an organic material. In order to send an electronic signal from one semiconductor chip to another, the signal must first pass from one of the semiconductor chips down through a via in the substrate, laterally across the motherboard, and back up through another via connected to the other semiconductor chip.

The use of vias for power, ground, and signal conductors at the same time is unsuitable for the power requirements of state of the art microelectronic applications. Because of high loop inductance of the system, three voltage drops, also known as first, second, and third "droops," occur at different times during use. A number of decoupling capacitors must be used, increasing the cost of the assembly. The signal integrity of signals sent between the semiconductor chips is weakened due impedance mismatches between the different substrates. The resistance encountered by the current used for power the chips is unnecessarily high because not all of the vias are used for power so that the power delivered to the semiconductor chips is not maximized. The organic core does not have a good coefficient of thermal expansion, and for mechanical support, it must be made thicker which adds inductance and increases the first droop.

BRIEF DESCRIPTION OF THE DRAWINGS

The invention is described by way of example with reference to the accompanying drawings, wherein.

DETAILED DESCRIPTION OF THE INVENTION

FIG. 1 to FIG. 5 of the accompanying drawings illustrate an electronic assembly according to one embodiment of the invention. The electronic assembly includes a motherboard, a first microelectronic die on a package substrate, a second microelectronic die, and a strip of flex tape interconnecting the microelectronic dies. The package substrate has a metal core with via openings, power conductors connecting a top and bottom surface of the substrate and passing through the via openings, and ground conductors interconnecting the metal core with the top and bottom surfaces of the package substrate. The flex tape has signal conductors which interconnect the microelectronic dies. Power is provided to the first microelectronic die via the power conductors. IO signals are sent between the microelectronic dies over the signal conductors in the flex tape.

Figure 1:
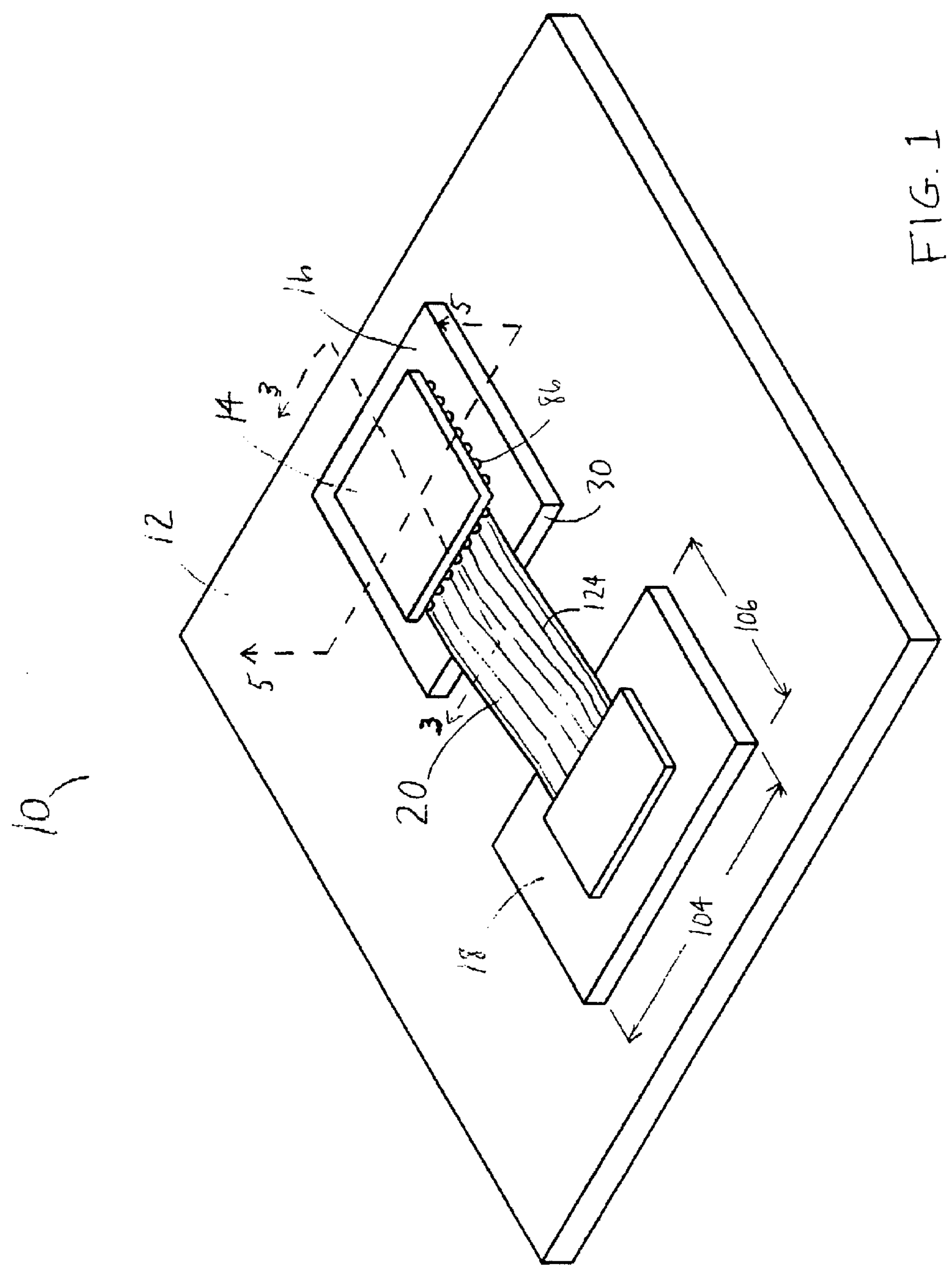
FIG. 1 is a perspective view of an electronic assembly including a motherboard, a microprocessor on a package substrate, a chipset, and a strip of flex tape, according to an embodiment of the invention.
Figure 2:
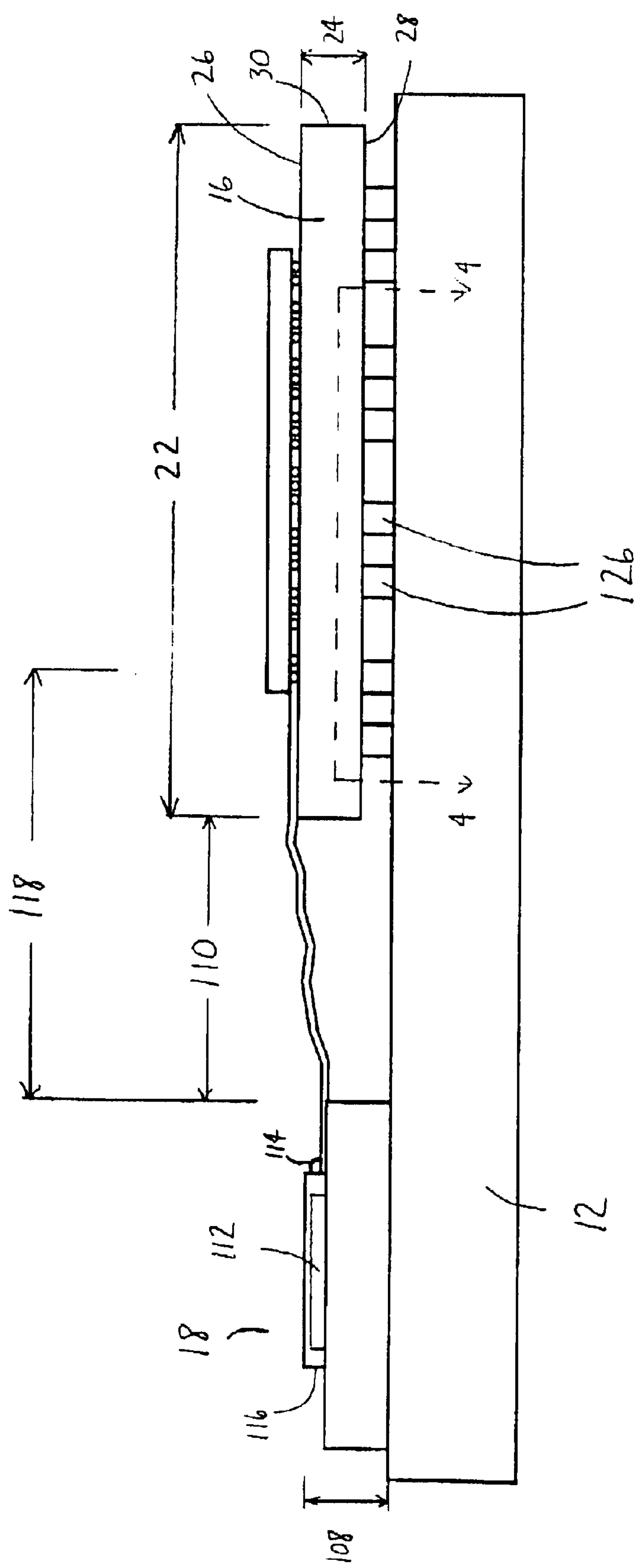
FIG. 2 is a side view of the electronic assembly.

FIGS. 1 and 2 illustrate an electronic assembly 10 for use in a computer, including a motherboard 12, a microprocessor 14 on a package substrate 16, a chip set 18, and a strip 20 of flex tape. It should be noted that FIGS. 1 to 5 are merely illustrative and may not be drawn to scale.

The motherboard 12 is a large silicon plane having a plurality of sockets for securing and providing electric signals to various microelectronic dies as is commonly understood in the art.

The package substrate 16 is square in shape with side lengths 22 of 10 cm and a thickness 24 of 1000 microns. The thickness 24 of the package substrate 16 may range, for example, between 500 and 1300 microns. The substrate 16 has a top surface 26, a bottom surface 28, and an outer edge 30.

Figure 3:
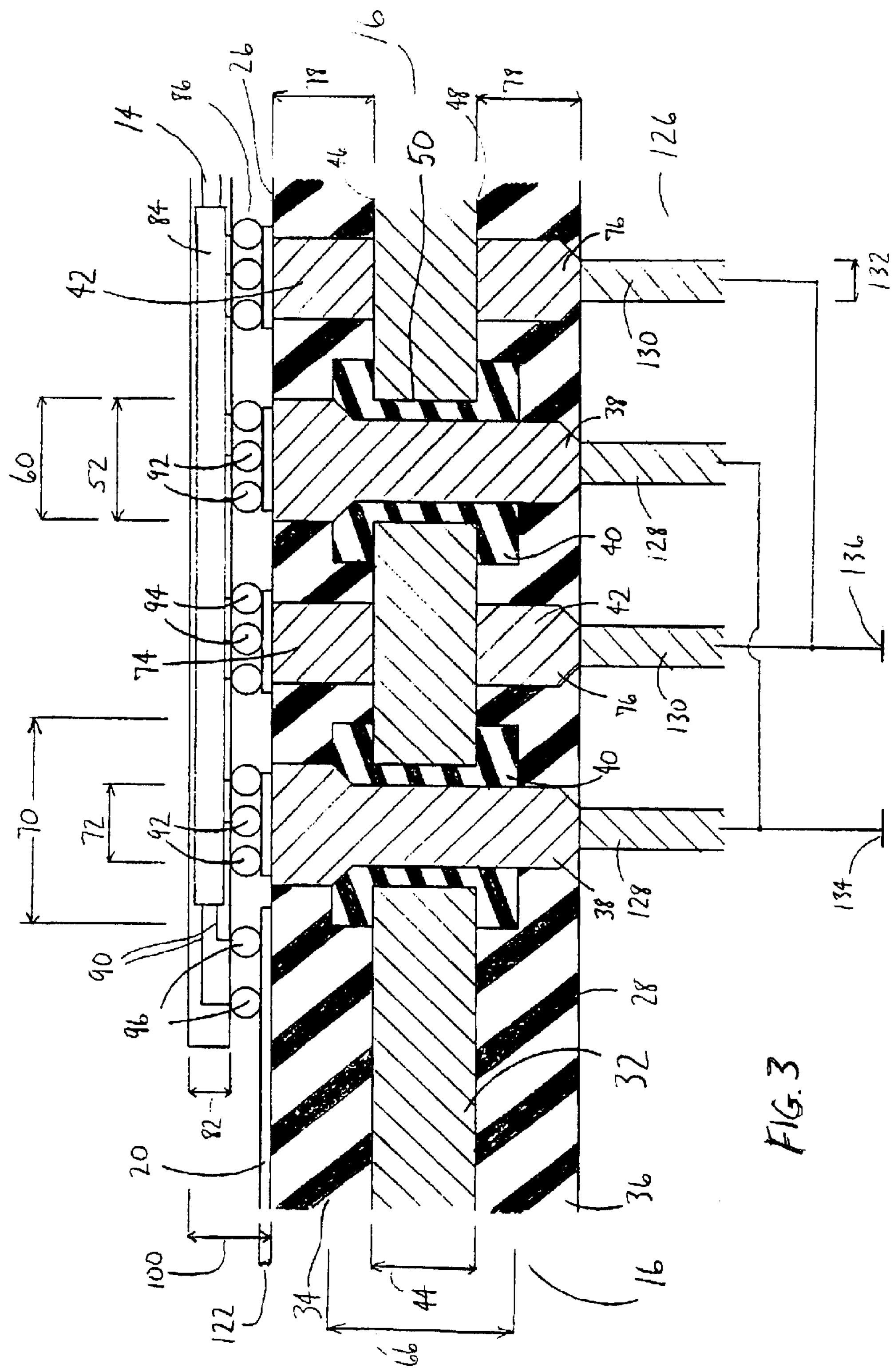
FIG. 3 is a cross-sectional side view on 3—3 in FIG. 1 of the microprocessor and the package substrate.

FIG. 3 illustrates the microprocessor 14 and the package substrate 16. The package substrate 16 includes a metal core 32, a first build-up layer 34, a second build-up layer 36, a plurality of power conductors 38, a plurality of insulating bodies 40, and a plurality of ground conductors 42.

The metal core 32 is in the shape of a plane which extends to the outer edge 30 of the package substrate 16 and has a substantially uniform thickness 44 of 250 microns. However, the thickness 44 of the metal core 32 may range, for example, between 200 and 400 microns. The metal core 32 has an upper 46 and a lower 48 surface and is made of copper. The metal core 32 has an array of circular via openings 50 extending from the upper surface 46 to the lower surface 48 thereof. The via openings 50 have diameters 52 of 50 microns.

Figure 4:
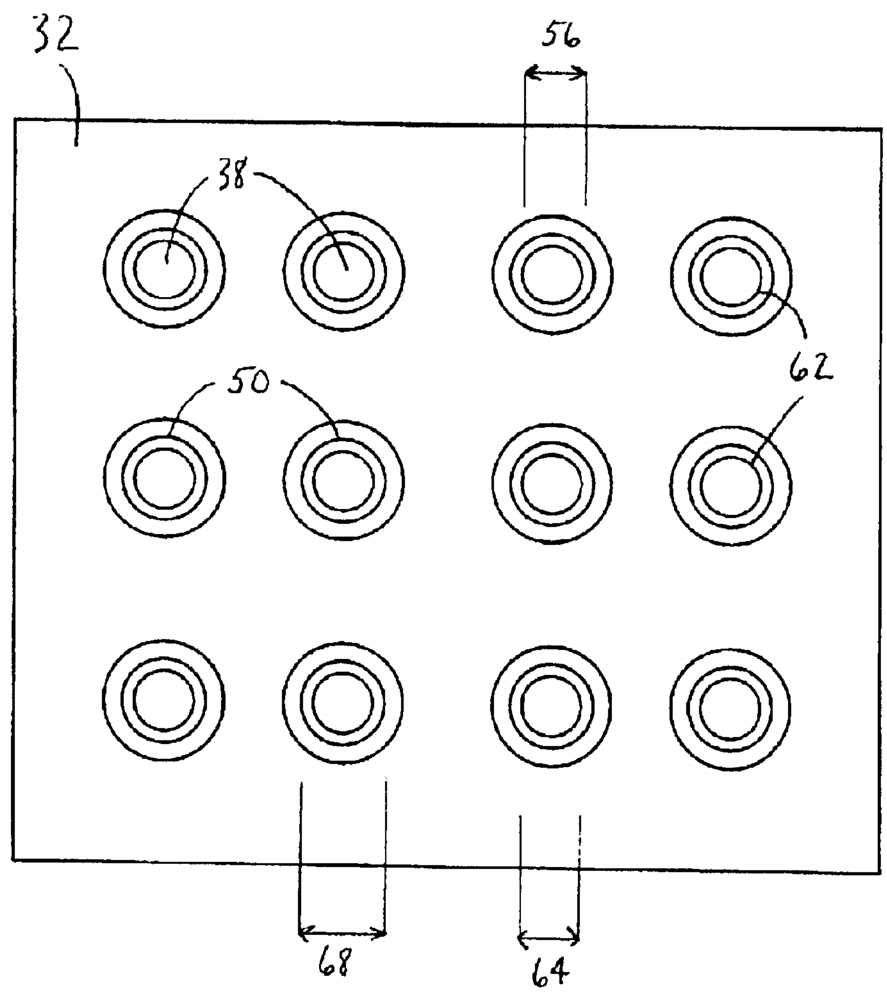
FIG. 4 is a cross-sectional top plan view on 4—4 in FIG. 2 of a metal core within the package substrate.

Referring to FIG. 3 and FIG. 4, the power conductors 38 are metallic, cylindrically shaped bodies extending between the top surface 26 and the bottom surface 28 of the package substrate 16 and extend through the via openings 50 of the metal core 32. The length of the power conductors 38 may range, for example, between 500 and 1300 microns, depending on the thickness of the package substrate 16. Central portions 54 of the power conductors 38, which pass through the via openings 50, have diameters 56 of 35 microns. Upper portions 58 of the power conductors 38, located above the via openings 50, have diameters 60 of 50 microns. The power conductors 38 are typically made of a metal such as copper.

The insulating bodies 40 are vertically oriented dumbbell shaped bodies with vertical passageways 62 therethrough and are located between the power conductors 38 and the metal core 32. The vertical passageways 62, through which the power conductors 38 pass, have diameters 64 of 35 microns. The insulating bodies 40 have heights 66 of 300 microns, extending 25 microns above and below the metal core 32, small outer diameters 68 of 50 microns extending within the via openings 50, and large outer diameters 70 of 100 microns above and below the via openings 50. The insulating bodies 40 are made of silicon oxide.

The ground conductors 42 are metallic, cylindrically shaped bodies extending vertically within the package substrate 16. The ground conductors 42 have diameters 72 of 35 microns. Each ground conductor 42 has an upper piece 74 and a lower piece 76. The upper piece 74 of each ground conductor 42 connects the top surface 26 of the package substrate 12 to the upper surface 46 of the metal core 32. The lower piece 76 of each ground conductor 42 lies directly beneath the upper piece 74 of the respective ground conductor 42 and connects the bottom surface 28 of the package substrate 12 to lower surface 48 of the metal core 32. The ground conductors 42 contact the metal core 32 between the via openings 50.

The first build-up layer 34 is located adjacent to the upper surface 46 of the metal core 32 and includes of a plurality of alternating conducting and insulating layers, and the second build-up layer 36 is located adjacent to the lower surface 48 of the metal core 32 and comprises a plurality of alternating conducting and insulating layers. The first 34 and second 36 build-up layers each have a thickness 78 of approximately 375 microns.

Referring to FIG. 1 and FIG. 2, the microprocessor 14 is located on a central portion of the top surface 26 of the package substrate 16. The microprocessor 14 is square in shape and has side lengths 80 of 3 cm and a thickness 82 of, for example, 700 microns. The microprocessor 14 includes an integrated circuit 84 formed therein, as is commonly understood in the art, and a plurality of substantially spherical, conductive contacts 86 located on a bottom surface 88 thereof. The contacts 86 are placed between the microprocessor 14 and the top surface 26 of the package substrate 16 and are connected to the integrated circuit 84 by a plurality of chip conductors 90. The spherical contacts 86 include power contacts 92, ground contacts 94, and signal contacts 96. The contacts 86 connect and secure the microprocessor 14 to the package substrate 16 and support an upper surface 96 of the microprocessor 14 to a height 100 of approximately 730 microns above the top surface 26 of the package substrate 16.

Figure 5:
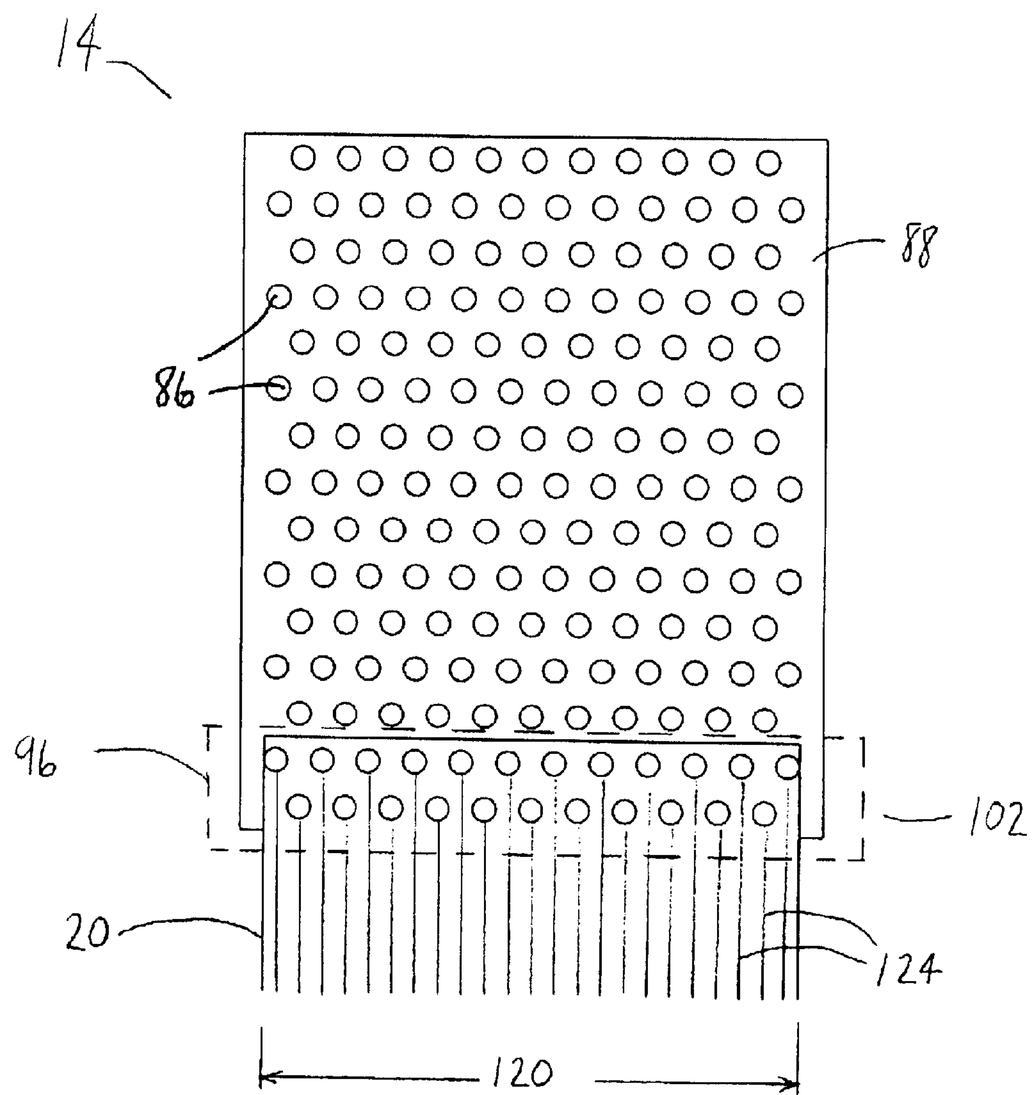
FIG. 5 is a bottom view on 5—5 in FIG. 1 of the microprocessor.

FIG. 5 illustrates the bottom surface 88 of the microprocessor 14. The bottom surface 88 of the microprocessor 14 is covered with contacts 86 arranged in rows. The signal contacts 96 are arranged in two rows along a side 102 of the microprocessor 14. The rows of power 92 and ground 94 contacts are arranged in groups over the rest of the bottom surface 88 of the microprocessor 14.

Referring again to FIG. 3, the power contacts 92 of the microprocessor 14 are placed directly above and touch the power conductors 38, and the ground contacts 94 are placed directly above and touch the ground conductors 42.

Referring to FIG. 1 and FIG. 2 in combination, the chipset 18 is rectangular with a length 104 of 2 cm, a width 106 of 1 cm, and a thickness 108 of 0.25 cm. The chipset 18 is located on the motherboard 12 and spaced by a distance 110 of 1.5 cm from the package substrate 16. The chipset 18 includes a substrate with a microelectronic die on a central portion of an upper surface thereof with an integrated circuit 112 formed within the die, as is commonly understood in the art. Electrical connectors 114 extend outwards and downwards away from sides 116 of the chipset and are connected to the integrated circuit 112 within the chipset.

Referring now to FIGS. 1, 2, 3, and 5, the strip 20 of flex tape extends from beneath the signal contacts 96 located on the microprocessor 14 outwards across the top surface 26 of the package substrate 16 and over the outer edge 30 of the package substrate 16 to the integrated circuit 112 of the chipset 18. The strip 20 is suspended above the motherboard 12. The flex tape strip 20 has a length 118 of 1.75 cm, a width 120 of 1.9 cm, and a thickness 122 of 10 microns. The thickness of the flex tape may range, for example, between 5 and 30 microns. The flex tape strip 20 has a substrate made of a flexible material such as Mylar and a plurality of signal conductors 124, or conductive strips, on the substrate interconnecting the signal contacts 96 of the microprocessor 14 to the electrical connectors 114 of the chipset 18. Although only one chipset 18 is shown in this embodiment, it should be understood that, more chipsets, or other types of microelectronic dies, may be placed on the motherboard and electrically connected to the microprocessor in the same manner.

Referring again to FIG. 2 and FIG. 3, a plurality of conductive pins 126 extend downward from the bottom surface 28 of the package substrate 16 and are inserted into the sockets located on the motherboard, as is commonly understood in the art. The pins 126 include power pins 128 connected to the power conductors 38 and ground pins 130 connected to the ground conductors 42. The pins 126 have diameters 132 of approximately 25 microns. As shown schematically in FIG. 3, the power pins 128 are connected to a first electric terminal 134 of a computer through the sockets of the motherboard, which supplies power to the electronic assembly 10. The ground pins 130 are connected to a second electric terminal 136 of a computer through the sockets of the motherboard 12, which supplies a ground for the electronic assembly 10. The computer has a memory for storing set instructions and a process server connected to the memory for executing the instructions, as is commonly understood.

In use, an electric current is supplied by the computer to the integrated circuit 84 in the microprocessor 14 through the power pins 128, the power conductors 38, and the power contacts 92. Electric signals, such as IO signals, are then sent from the integrated circuit 84 in the microprocessor 14 through the signal contacts 96, the signal conductors 124, the electrical connectors 114 of the chipset, and into the integrated circuit 112 of the chipset 18. Then other electric signals are sent back to the microprocessor 14 via the signal conductors 124 in the flex tape. The electric signals are sent directly to and from the chipset 18 across the upper surface 26 of the package substrate 16 and above the motherboard 12 without having to travel back through the interior of the package substrate 16 and through the motherboard 12. Thus, all of the pins 126 can be used for either power or ground and need not be sacrificed for providing electrical signals.

One advantage of this system is that the first voltage droop is reduced by the use of the metal core and the second and third voltage droops are reduced primarily by the use of the signal conductors because the overall inductance of the electronic assembly is reduced. Therefore, the number of decoupling capacitors can be reduced which lowers the cost of the assembly. A further advantage is that the signal integrity of the signals sent to and from the memory chips is improved because a more direct pathway is provided for the signals when compared to a conventional circuit board. A further advantage is when compared to a conventional circuit board, the number of power and ground vias are doubled, therefore, the resistance is decreased by 50% and power is increased to the microprocessor. A further advantage is that the thickness of the substrate can be reduced without a brace or any additional support needed for the substrate because of the mechanical strength added to the substrate by the use of the metal core.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly, comprising:

a substrate including a metal plane having a plurality of via openings therethrough, a plurality a first conductors passing through the via openings from an upper surface to a lower surface of the metal plane, and a plurality of insulating bodies in the via openings, each surrounding a respective first conductor and insulating the respective first conductor from the metal plane;

a first microelectronic die, on the substrate, having a first integrated circuit, first contacts connected to the first conductors, second contacts connected to the metal plane, and first signal contacts connected to the first integrated circuit;

a second microelectronic die having a second integrated circuit and second signal contacts connected to the second integrated circuit; and a flexible tape having a flexible substrate and a plurality of signal conductors, carried by the flexible substrate, interconnecting the first signal contacts and second signal contacts.

2. The electronic assembly of claim 1, wherein the first conductors are power conductors.

3. The electronic assembly of claim 2, wherein the metal plane is a ground plane.

4. The electronic assembly of claim 3, further comprising a power supply connected to the power conductors to conduct an electric current to the first integrated circuit of the first microelectronic die allowing the first integrated circuit to send electric signals to the second integrated circuit of the second microelectronic die through the signal conductors of the flexible tape.

5. The electronic assembly of claim 4, further comprising a plurality of ground conductors connected between the upper surface of the metal plane and a top surface of the substrate and connected between the lower surface of the metal plane and a bottom surface of the substrate.

6. The electronic assembly of claim 5, wherein the substrate has a thickness of between 500 and 1300 microns.

7. The electronic assembly of claim 6, wherein the metal plane has a thickness of between 200 and 400 microns.

8. The electronic assembly of claim 7, wherein the first conductors have lengths of between 500 and 1300 microns.

9. The electronic assembly of claim 8, wherein the metal plane and the ground conductors are electrically disconnected from the power conductors within the substrate.

10. The electronic assembly of claim 9, wherein the first microelectronic die is a microprocessor.

11. The electronic assembly of claim 10, wherein the second microelectronic die is a chipset.

12. The electronic assembly of claim 11, wherein the microprocessor and the chipset are connected to a motherboard.

13. The electronic assembly of claim 2, wherein the flexible tape is on the substrate.

14. The electronic assembly of claim 13, wherein the flexible tape has a thickness between 5 microns and 30 microns.

15. An electronic assembly, comprising:

a substrate having top and bottom surfaces including a ground plane having a plurality of via openings therethrough from an upper surface to a lower surface thereof, a plurality of ground conductors connecting the upper surface of the ground plane and the top surface of the substrate and connecting the lower surface of the ground plane to the bottom surface of the substrate, a plurality a power conductors passing through the via openings from the upper surface to the lower surface of the ground plane, and a plurality of insulating bodies in the via openings, each surrounding a respective power conductor and insulating the respective power conductor from the ground plane;

a first microelectronic die on the substrate having a first integrated circuit, power contacts connected to the power conductors, ground contacts connected to the ground conductors, and first signal contacts connected to the first integrated circuit;

a second microelectronic die having a second integrated circuit and second signal contacts connected to the second integrated circuit;

a flexible tape having a flexible substrate and a plurality of signal conductors, carried by the flexible substrate, interconnecting the first signal contacts and second signal contacts; and a power supply connected to the power conductors to conduct an electric current to the first integrated circuit to send electric signals to the second integrated circuit of the second microelectronic die through the signal conductors of the flexible tape.

16. The electronic assembly of claim 15, wherein the flexible tape is between the substrate and the first microelectronic die.

17. The electronic assembly of claim 16, further comprising a third microelectronic die having a third integrated circuit and third signal contacts connected to the third integrated circuit and the signal conductors, the signal conductors interconnecting the first signal contacts and the third signal contacts.

18. An electronic assembly, comprising:

a substrate, having top and bottom surfaces, including a ground plane having a plurality of via openings therethrough from an upper surface to a lower surface thereof, a plurality of ground conductors connecting the upper surface of the ground plane and the top surface of the substrate and connecting the lower surface of the ground plane to the bottom surface of the substrate, a plurality a power conductors passing through the via openings from the upper surface to the lower surface of the ground plane, and a plurality of insulating bodies in the via openings, each surrounding a respective power conductor and insulating the respective power conductor from the ground plane;

a microprocessor on the substrate having a first integrated circuit, power contacts connected to the power conductors, ground contacts connected to the ground conductors, and first signal contacts connected to the first integrated circuit;

a chipset having a second integrated circuit and second signal contacts connected to the second integrated circuit;

a flexible tape on the substrate extending between the microprocessor and the chipset having a flexible substrate and a plurality of signal conductors, carried by the flexible substrate, interconnecting the first signal contacts and second signal contacts; and a power supply connected to the power conductors to conduct an electric current to the first integrated circuit of the microprocessor to send electric signals to the second integrated circuit of the chipset through the signal conductors of the flexible tape.

19. The electronic assembly of claim 18, further comprising a second chipset having a third integrated circuit and third signal contacts connected to the third integrated circuit.

20. The electronic assembly of claim 19, wherein the flexible tape extends between the microprocessor and the second chipset, and the plurality of signal conductors interconnect the second signal contacts and the third signal contacts.

* * * * *

UNITED STATES PATENT AND TRADEMARK OFFICE

CERTIFICATE OF CORRECTION

PATENT NO. : 6,803,649 B1
DATED : October 12, 2004
INVENTOR(S) : He et al.

It is certified that error appears in the above-identified patent and that said Letters Patent is hereby corrected as shown below:

Title page,
Item [57], ABSTRACT,
Line 10, delete "surface" and insert -- surfaces --.

Column 1,
Line 37, delete "for" and insert -- to --.

Signed and Sealed this

Twenty-sixth Day of July, 2005

JON W. DUDAS
*Director of the United States Patent and Trademark Office*